United States Patent [19]
Gardner et al.

[11] Patent Number: 6,051,487
[45] Date of Patent: *Apr. 18, 2000

[54] SEMICONDUCTOR DEVICE FABRICATION USING A SACRIFICIAL PLUG FOR DEFINING A REGION FOR A GATE ELECTRODE

[75] Inventors: Mark I. Gardner, Cedar Creek; H. Jim Fulford, Austin; Mark C. Gilmer, Austin; Robert Paiz, Austin, all of Tex.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/993,612
[22] Filed: Dec. 18, 1997
[51] Int. Cl.$^7$ .............................................. H01L 21/3205
[52] U.S. Cl. .......................... 438/585; 438/595; 438/305
[58] Field of Search ................................. 438/305, 595, 438/585

[56] References Cited

U.S. PATENT DOCUMENTS

| | | | |
|---|---|---|---|
| 4,521,448 | 6/1985 | Sasaki | 438/586 |
| 5,316,981 | 5/1994 | Gardner et al. | 438/264 |
| 5,391,510 | 2/1995 | Hsu et al. | 438/301 |
| 5,393,686 | 2/1995 | Yeh et al. | 438/264 |
| 5,548,143 | 8/1996 | Lee | 257/269 |
| 5,576,227 | 11/1996 | Hsu | 438/291 |
| 5,773,348 | 6/1998 | Wu | 438/305 |
| 5,854,102 | 12/1998 | Gonzalez et al. | 438/237 |

*Primary Examiner*—John F. Niebling
*Assistant Examiner*—John Murphy

[57] ABSTRACT

A semiconductor device is formed by forming a sacrificial plug over a substrate and forming active regions in the substrate adjacent the sacrificial plug. A film is then formed over portions of the substrate adjacent the sacrificial plug. The sacrificial plug is then selectively removed leaving an opening in the film, and a gate electrode is formed in the opening. The sacrificial plug can be formed from several materials including, for example, polysilicon and nitrogen-bearing species such as nitride. The gate electrode may, for example, be formed from temperature-sensitive metals such as copper since the gate electrode may be formed subsequent to high temperature steps of the fabrication, such as a source drain anneal, for example.

21 Claims, 4 Drawing Sheets

SEMICONDUCTOR DEVICE FABRICATION USING A SACRIFICIAL PLUG FOR DEFINING A REGION FOR A GATE ELECTRODE

FIELD OF THE INVENTION

The present invention is directed generally to semiconductor devices and, more particularly, to a method of fabricating a semiconductor device using a sacrificial plug for defining a region for a gate electrode.

BACKGROUND OF THE INVENTION

Over the last few decades, the electronics industry has undergone a revolution by the use of semiconductor technology to fabricate small, highly integrated electronic devices. The most common and important semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103 acts as a conductor. An input signal is typically applied to the gate electrode 103 via a gate terminal (not shown). Heavily-doped source/drain regions 105 are formed in the semiconductor substrate 101 and are connected to source/drain terminals (not shown). As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to an active region used for the formation of a source or drain.

A channel region 107 is formed in the semiconductor substrate 101 beneath the gate electrode 103 and separates the source/drain regions 105. The channel is typically lightly doped with a dopant of a type opposite to that of the source/drain regions 105. The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107.

The source/drain regions 105, illustrated in FIG. 1, are lightly-doped-drain (LDD) structures. Each LDD structure includes a lightly-doped, lower conductivity region 106 near the channel region 107 and a heavily-doped, higher conductivity region 104 typically connected to the source/drain terminal. Generally, the LDD structures are typically formed by implanting a first dopant into active regions adjacent the gate electrode 103 at relatively low concentration levels to form the lightly-doped regions 106; forming spacers 102 on sidewalls of the gate electrode 103; and implanting a second dopant into the active regions at higher concentration levels to form the heavily-doped regions 104. The substrate is typically annealed to activate the dopant in the heavily-doped regions and drive the dopant deeper into the substrate 101.

After the LDD structures have been formed, a relatively thick oxide layer (not shown), referred to as a contact formation layer, is disposed over the substrate 101. Openings are generally cut into the contact formation layer to expose the source/drain regions 105 and the surface of the gate electrode 103. The exposed areas are then filled with a metal, such as tungsten, which is used to connect the active elements with other devices on the chip.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner, an electric field controls the current flow through the channel region 107. This type of device is commonly referred to as a MOS field-effect-transistor (MOSFET).

The formation of the gate electrode is an important step in the fabrication process. Typically, the gate electrode is formed by depositing a layer of polysilicon over a thin silicon dioxide layer (i.e., the gate insulating layer), patterning the polysilicon layer, and selectively removing portions of the polysilicon layer and the underlying silicon dioxide layer to form one or more gate electrodes as illustrated above. Using the gate electrode for alignment, dopants are implanted into the substrate to form the source/drain regions.

These conventional techniques for forming the gate electrode impose limitations on the fabrication process. In particular, the use of the gate electrode to align source/drain implants imposes significant limitations of the type of gate electrode material which may be used. For example, since the source/drain regions are typically annealed to activate the dopants therein, the gate electrode is typically limited to a material, such as polysilicon, which can withstand the high temperatures of the source/drain anneal.

SUMMARY OF THE INVENTION

Generally, the present invention relates to a method of fabricating a semiconductor device using a sacrificial plug for defining a region for a gate electrode. The method can, for example, allow the gate electrode to be formed from materials sensitive to high temperatures (e.g. metal), since the gate electrode may be formed subsequent to high temperature steps of the fabrication (e.g. source/drain anneal).

In accordance with one embodiment of the invention, a semiconductor device is formed by forming a sacrificial plug over a substrate and forming active regions in the substrate adjacent the sacrificial plug. A film is then formed over portions of the substrate adjacent the sacrificial plug. The sacrificial plug is selectively removable with respect to the film. The sacrificial plug is then selectively removed leaving an opening in the film, and a gate electrode is formed in the opening. The sacrificial plug can be formed from several materials including, for example, polysilicon and nitrogen-bearing species such as nitride. The gate electrode may be formed from metal, for example.

The above summary of the present invention is not intended to describe every incrementation of the present invention. The figures and the detailed description which follow exemplify the embodiments more particularly.

BRIEF DESCRIPTION OF THE DRAWINGS

The invention may be more completely understood in consideration of the detailed description of the following embodiments of the invention in connection with the accompanying drawings, in which.

Figure 1:
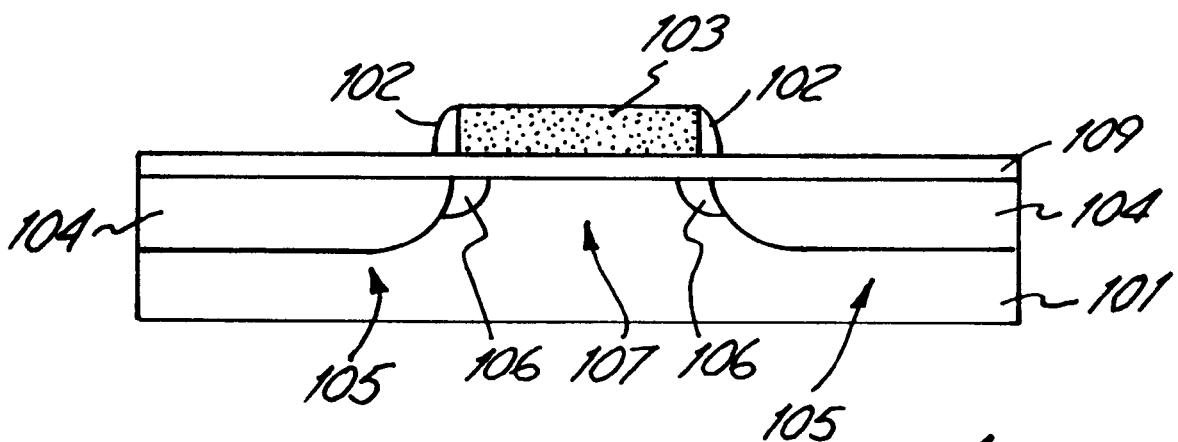
FIG. 1 is a typical MOS transistor.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The present invention is believed to be applicable to the fabrication of a number of semiconductor devices, including in particular MOS, CMOS, and BICMOS structures. While the present invention is not so limited, an appreciation of various aspects of the invention will be gained through a discussion of the fabrication process and characteristics of such a device in connection with the examples provided below.

FIGS. 2A–2F illustrate an exemplary process for fabricating a semiconductor device using a sacrificial plug for defining a region for a gate electrode. In this exemplary process, background implants into a substrate 201, such as well implants, punchthrough implants, and threshold voltage implants are typically initially performed to provide the background doping for the substrate 201. The substrate 201 is typically formed from silicon. The various background implants may be performed in a number of different manners as is well known in the art.

Figure 2A:
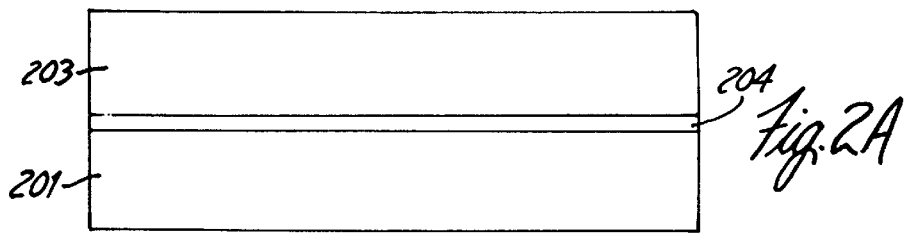
FIGS. 2A–2F illustrate an exemplary process in accordance with one embodiment of the invention.

Following the background implants, an insulating layer 204 is formed on the substrate 201, as illustrated in FIG. 2A. The insulating layer 204 may be formed, for example, from an oxide such as $SiO_2$ using, for example, well-known deposition or growth techniques. Suitable thicknesses for an oxide insulating layer range from about 25–75Å, and more typically about 50Å, in many applications.

Figure 2B:
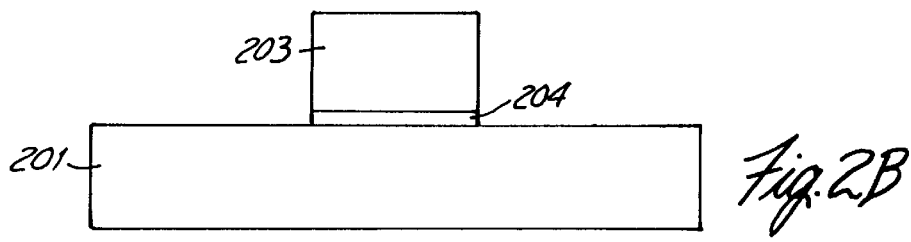

One or more sacrificial plugs 203 (only one of which is shown) are formed on the insulating layer 204, as shown in FIGS. 2A–2B. The sacrificial plug 203 is formed from a material which is selectively removable with respect to a later-formed film 207. If the later removal of sacrificial plug 203 is to be made without removing the insulating layer 204, the sacrificial plug 203 may be formed from a material which is also selectively removable with respect to the insulating layer 204. The sacrificial plug 203 may be formed, for example, from a material such as polysilicon, a nitrogen-bearing species such as nitride, or even some relatively temperature insensitive metals, Cobalt. The sacrificial plug 203 may be formed, for example, by forming a layer using well-known deposition techniques, and removing a part of the layer to form the sacrificial plug 203 using well-known masking and etching techniques. Portions of the insulating layer 204 adjacent the sacrificial plug 203 may also be removed, as shown in FIG. 2B. The portions of insulation layer 204 may be removed using, for example, well-known etching techniques.

The sacrificial plug 203 will be used to define a region for a gate electrode on the substrate 201. The thickness and width of the sacrificial plug 203 are typically chosen in consideration of the desired thickness and width of the gate electrode. Suitable thicknesses and widths of the sacrificial plug 203 range from about 1000 to 3000Å, and about 0.1 to 0.25 microns, respectively, for many applications.

Figure 2C:
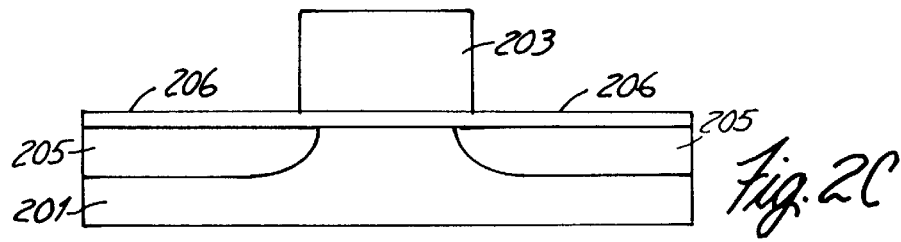

Active regions 205 are formed in portions of the substrate 201 adjacent the sacrificial plug 203, as shown in FIG. 2C. The active regions 205 may, for example, be LDD (lightly-doped-drain) source/drain regions. An LDD source/drain region may be formed by making two implants in the substrate 201. Typically, the first implant is a light dose of a dopant material, and the second implant is a heavier dose, deeper implant of a similar-type or the same dopant material. The first dose is typically implanted into the substrate 201 when the semiconductor device has the configuration shown in FIG. 2B. Before the second dose is implanted, spacers (not shown) are formed adjacent to the sacrificial plug 203. The spacers are used to space the second dopant implant from the region below the insulating layer 204 (i.e. what will be the channel region 202 of the semiconductor device). The dopant implants, as well as spacer formation, may be done using well-known techniques.

The conductivity type of the dopant(s) used to form the active regions 205 depends on the type (e.g. NMOS or PMOS) of device being formed. For example, in an NMOS transistor the source/drain regions are formed by implanting an n-type dopant, such as arsenic or phosphorus. Correspondingly, in an PMOS transistor the source/drain regions are formed by implanting a p-type dopant, such as boron.

After forming the active regions 205, the substrate 201 may be heated to activate the dopants in the active regions 205 and to drive the dopants deeper into the substrate 201. The substrate 201 may be heated using, e.g., well-known anneal techniques such as rapid thermal anneal (RTA). After forming the active regions 205, a silicide layer 206 may be formed over the active regions 205, as shown in FIG. 2C. This may be done using, for example, well-known silicidation techniques.

Figure 2D:
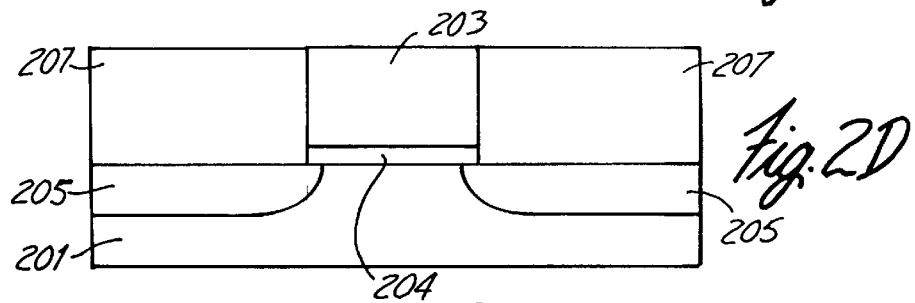

A film 207 is formed over the portions of substrate 201 adjacent sacrificial plug 203, as shown in FIG. 2D. Film 207 may be formed, for example, using well-known deposition techniques. In an exemplary embodiment, the film 207 is deposited to a thickness greater than that of the sacrificial plug 203 and then planarized to obtain substantially the same thickness as sacrificial plug 203. The film may be planarized using, for example, well-known chemical-mechanical polishing techniques.

The material of film 207 is chosen so that the sacrificial plug 203 may be selectively removed with respect to film 207. For example, film 207 may be formed from an oxide when sacrificial plug 203 is formed from a material such as nitride, metal, or polysilicon, which is selectively removable with respect to oxide.

Figure 2E:
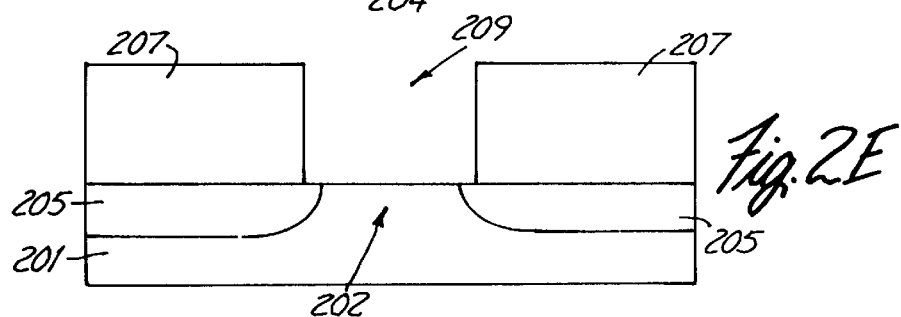

The sacrificial plug 203 is selectively removed, leaving an opening 209 in film 207, as illustrated in FIG. 2E. The sacrificial plug 203 may be removed, for example, by using etching techniques, such as plasma etching or caros stripping, which selectively etch the sacrificial plug 203 and leave the film 207 substantially intact. The opening 209 will be used to form a gate electrode. The opening 209 is the region where sacrificial plug 203 was previously situated, and may be defined by boundaries of adjacent films 207. The insulating layer 204 may also be removed as shown in FIG. 2E. This may be done using, for example, well-known etching techniques.

Figure 2F:
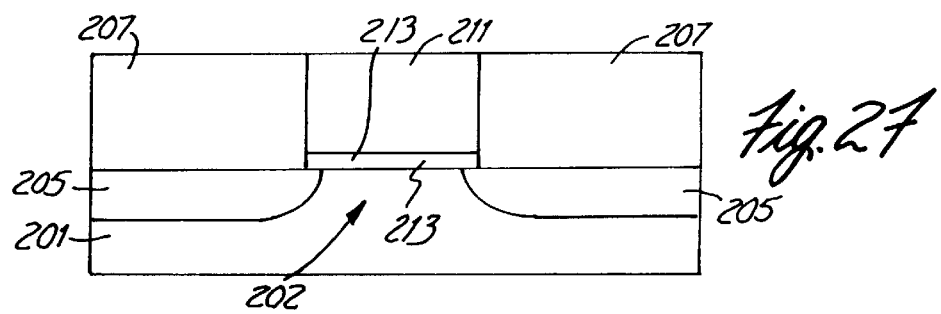

A gate insulating layer 213 is formed over the substrate 201 in the opening 209, as illustrated in FIG. 2F. The gate insulating layer 213 may be formed from several different dielectric materials including, for example, oxides such as SiO$_2$. The gate insulating layer 213 may be formed using, for example, well-known deposition or growth techniques. The gate insulating layer 213 will be used to insulate a gate electrode from the channel region 202 of the substrate 201. The thickness of the gate insulating layer 213 is suitably selected in consideration of the desired separation of the gate electrode from the substrate 201 taking into account the characteristics (e.g. dielectric constant) of the gate insulating layer 213. Thicknesses of an SiO$_2$ gate insulating layer 213 ranging from about 15 to 50 Å would be suitable for many applications.

A gate electrode 211 is formed in the opening 209 over the gate insulating layer 213, as illustrated in FIG. 2F. The gate electrode 211 may be formed from any suitable material, such as metal or polysilicon. The gate electrode 211 may, for example, be formed by depositing metal or polysilicon in opening 209. If the deposited metal or polysilicon has a thickness essentially greater than that of the film 207, it may be planarized using, e.g., well-known chemical-mechanical polishing techniques to obtain substantially the same thickness as film 207. Fabrication of the semiconductor device may continue with well-known processing steps such as contact formation, and so forth to complete the device structure.

Using the above processes, gate electrodes of a semiconductor device may be formed using a sacrificial plug. Moreover, the above process allows source/drain regions to be formed prior to the gate electrodes. This allows, for example, the gate electrode to be formed from materials, including metals such as copper, which are sensitive to high temperature treatments, such as the source/drain anneal. Of course, source/drain formation can alternatively be performed after forming the gate electrode 211 if desired.

The above process is provided by way of example and not of limitation. A wide variety of alternative processing techniques may be used to form a gate electrode using a sacrificial plug. A few of these processing variations are discussed below. It should be appreciated that one or more of these variations may be incorporated in any given fabrication process.

In one embodiment, a punchthrough implant and/or a threshold voltage implant are performed through the opening 209 prior to forming the gate electrode 211.

In another processing variation, the insulating layer 204 in the opening 209 is not removed from the substrate 201. Instead, the insulating layer 204 is used as a gate insulating layer and the gate electrode 211 is formed over the insulating layer 204. In this process, the sacrificial plug 203 is typically formed from a material which is selectively removable with respect to the insulating layer 204. If desired, the insulating layer may be annealed to improve the characteristics of the insulating layer 204. In another process, the insulating layer 204 may be left on and a second dielectric layer formed thereover, with the composite film used as a gate insulating layer.

In yet another alternative embodiment, insulating layer 204 is not formed and the sacrificial plug 203 is formed directly on the substrate 201. After the sacrificial plug 203 has been removed and prior to forming the gate electrode 211, a dielectric layer 213 is formed over the substrate 201 in the opening 209. The gate electrode 211 is then formed over the dielectric layer 213.

In yet another alternative embodiment, the portions of the insulating layer 204 adjacent the sacrificial plug 203 are removed after forming the active regions 205. This may be performed, for example, by implanting dopants through the insulating layer 204 to form the active regions 205. An exemplary process using this technique with a high permittivity insulating layer is provided in FIGS. 3A–3G.

FIGS. 3A–3G illustrate an exemplary process of fabricating a gate electrode using a sacrificial plug and a relatively high permittivity gate insulating layer. In accordance with this process, a relatively high permittivity gate insulating layer 303 is formed over a substrate 301. The high permittivity gate insulating layer 303 may be formed from a number of different dielectric materials having a dielectric constant or permittivity greater than that of silicon dioxide (dielectric constant of 4.2). The use of a high permittivity dielectric material for the gate insulating layer 303 enables the formation of thicker gate insulating layers having approximately the same capacitance (i.e., generating the same electric field given the same potential difference across the layer) as much thinner layers of silicon dioxide. For example, a 100 Å layer of a high permittivity dielectric having a dielectric constant of 42 has approximately the same capacitance as a 10 Å layer of silicon dioxide (dielectric constant =4.2). Moreover, use of a high permittivity gate insulating layer allows enhanced control over the uniformity of the gate insulating layer due to the greater thicknesses involved.

Suitable dielectric materials for the high permittivity gate insulating layer 303 include, for example, barium strontium titanate, titanium oxides, or lead zinc titanate. Suitable thicknesses of the gate insulating layer 303 range from about 100 to 2000Å for many applications. The high permittivity gate insulating layer 303 may, for example, be formed using well-known deposition techniques.

Figure 3A:
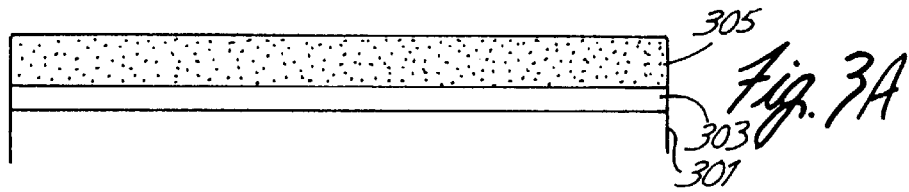
FIGS. 3A–3G illustrate an exemplary process in accordance with another embodiment of the invention.

A sacrificial layer 305 is formed over the high permittivity gate insulating layer 303. The resultant structure is illustrated in FIG. 3A. The sacrificial layer 305 is formed from a material which is selectively removable with respect to a later-formed film 317 (see FIG. 3E). In one particular embodiment, the sacrificial layer 305 is formed from a nitrogen-bearing species such as nitride. The use of a nitride sacrificial layer 305 advantageously inhibits oxidation of the sacrificial layer 305 by the high permittivity gate insulating layer 303 during subsequent processing when an oxide is used for the high permittivity gate insulating layer 303.

The sacrificial layer 305 will be used to form a sacrificial plug which in turn will be used to form a gate electrode. The thickness of the sacrificial layer 305 is suitably selected in consideration of the desired thickness of the gate electrode. Thicknesses of the sacrificial layer 305 ranging from about 1000 to 3000Å would be suitable for many applications. The sacrificial layer 305 may, for example, be formed using well-known deposition techniques.

Figure 3B:
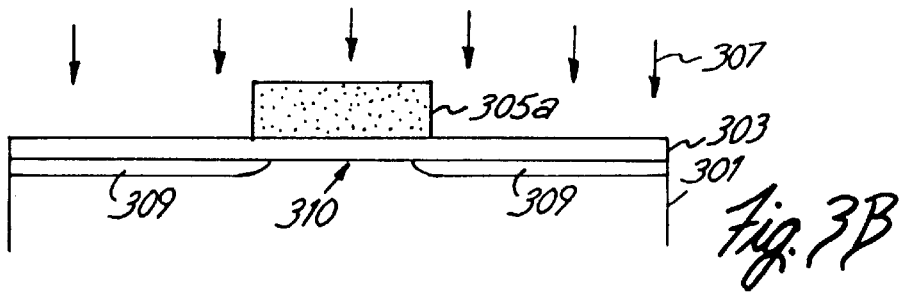

Portions of the sacrificial layer 305 are removed to form one or more sacrificial plugs (only one of which is shown), as illustrated in FIG. 3B. Selective removal of the sacrificial layer 305 to form the sacrificial plug 305a may be done using, for example, well-known photolithography and etching techniques. The sacrificial plug 305a will be used to form a gate electrode. The width of the sacrificial plug 305a is selected in consideration of the desired width of the gate electrode. Suitable widths range from about 0.1 to 0.25 microns for many applications.

Using the sacrificial plug 305a for alignment, a relatively low dose of a dopant 307 (e.g., boron or arsenic) is implanted into the substrate 301 to form lightly-doped regions 309 adjacent the sacrificial plug 305a. The resultant structure is illustrated in FIG. 3B. It should be appreciated that the region 310 between the lightly-doped regions 309 and under the sacrificial plug 305a will be used as a channel region in the completed device structure.

Figure 3C:
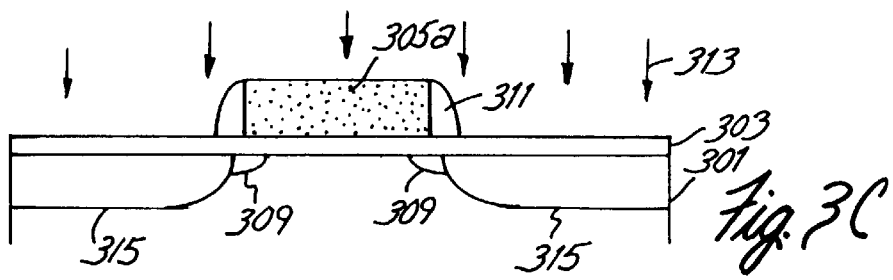

Spacers 311 are formed on sidewalls of the sacrificial plug 305a and a relatively high dose of a dopant is implanted into the substrate 301 using the spacers 311 for alignment. This implant, typically known as a source/drain implant, forms heavily doped regions 315 and substrate 301. The resultant structure is illustrated in FIG. 3C. The type of dopant 313 implanted is typically of the same type as the dopant 307 implanted earlier. Following the high dose implant dopant 313 the structure is typically annealed to activate the dopants within the lightly doped regions 309 and heavily doped regions 315. Optionally, the lightly doped regions 309 may be annealed prior to the formation of the heavily doped regions 315.

In the illustrated embodiment, the dopants 307 and 313 are implanted through the high permittivity gate insulating layer 303. The implant characteristics of the dopant 307 and 313 implants are suitably selected in consideration of the desired depth of the lightly doped regions 309 and heavily doped regions 315, taking into account the thickness of the high permittivity gate insulating layer 303 as well as the type of dopant being implanted. In alternate embodiments, portions of the high permittivity gate insulating layer 303 adjacent the sacrificial plug 305a may be removed prior to forming the active regions.

Figure 3D:
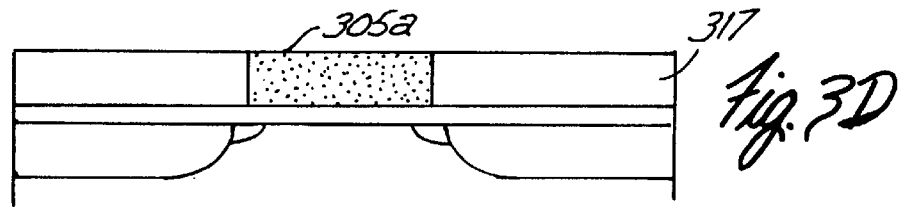

Film 317 is formed over portions of the substrate 301 adjacent the sacrificial plug 305a, as illustrated in FIG. 3D. The film 317 may be formed, for example, by depositing the film 317 over the substrate 301 and planarizing the film 317 with the upper surface of the sacrificial plug 305a. This may be done using, for example, well-known deposition and chemical-mechanical polishing techniques. The material of the film 317 is selected so that the sacrificial plug 305a may be selectively removed with respect to the film 317. For example, the film 317 may be formed from an oxide when the sacrificial plug 305a is formed from nitride.

Figure 3E:
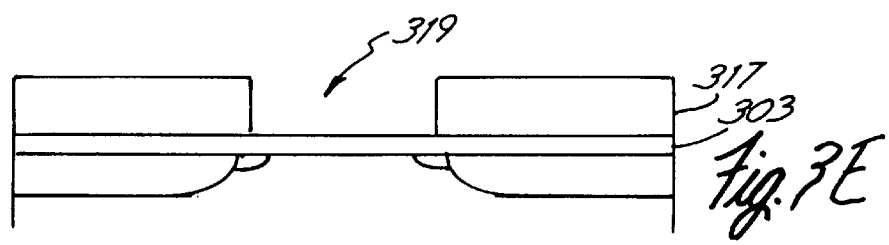

The sacrificial plug 305a is selectively removed leaving an opening 319 in the film 317, as illustrated in FIG. 3E. The sacrificial plug 305a may be removed using, for example, well-known etching techniques, such as plasma etching or caros stripping, which selectively etch the sacrificial plug 305a and leave the film 317 substantially intact.

Figure 3F:
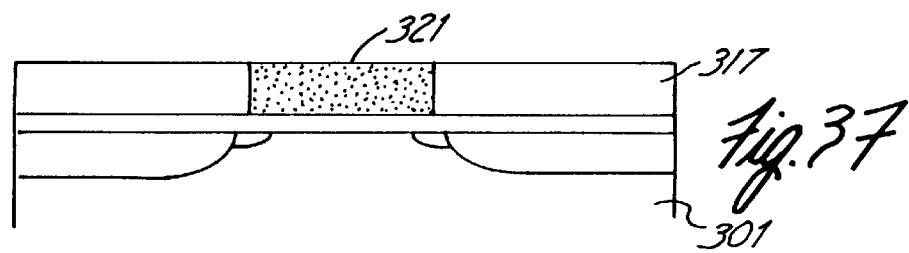
Figure 3G:
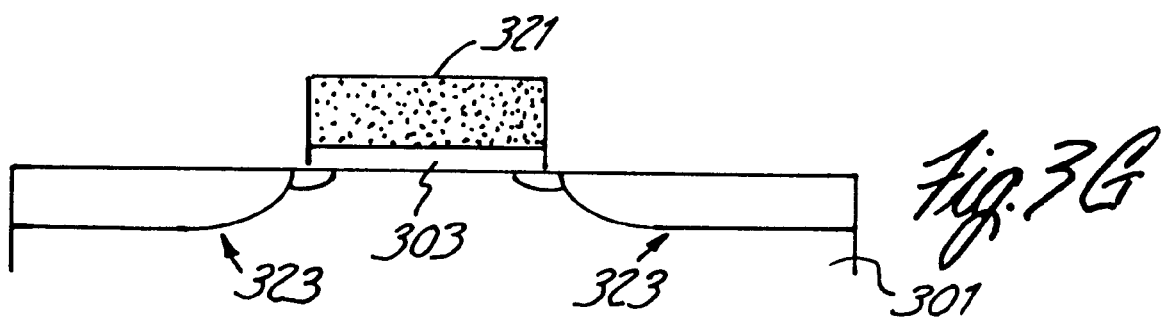

A gate electrode 321 is formed in the opening 319, as illustrated in FIG. 3F. The gate electrode 321 may be formed, for example, by depositing a layer of gate electrode material over the substrate 301 and planarizing the gate electrode material layer with the upper surface of the film 317. This may be done using, for example, well-known deposition and polishing techniques, such as chemical-mechanical polishing. The gate electrode 321 may be formed from a number of different materials including, for example, polysilicon or metals, such as cobalt, copper or tungsten.

After the gate electrode 321 has been formed in the opening 319, remaining portions of the film 317 are removed. This may be done using, for example, well-known etching techniques. As should be appreciated, these etching techniques are typically selective to the gate electrode 321. Portions of the high permittivity gate insulating layer 303 adjacent the gate electrode 321 are also removed. This may also be done using, for example, well-known etching techniques which are selective to the gate electrode 321. The resultant structure illustrated in FIG. 3G generally includes a gate electrode 321 separated from the substrate 301 by a high permittivity gate insulating layer 303 and LDD source/drain regions 323 adjacent the gate electrode 321. Fabrication may continue with well-known processing such as silicidation, contact formation, and so forth to complete the ultimate device structure. It should be noted that prior to silicidation, spacers may be formed on sidewalls of the gate electrode stack.

Using the above process, gate electrodes may be formed over a relatively high permittivity gate insulating layer using a sacrificial plug. Similar to the processes above, this process also allows for source/drain regions to be formed prior to the gate electrode. This, for example, allows the use of temperature-sensitive metals, such as copper, to be used as the gate electrode. Moreover, by using an oxidation inhibiting material such as nitride for the sacrificial plug, high permittivity oxides may be used for the gate insulating layer without causing substantial oxidation of the sacrificial plug.

The present invention is applicable to the fabrication of a number of different devices where formation of a gate electrode using a sacrificial plug is desirable. Such devices include, but are not limited to, MOS, CMOS, and BiCMOS structures. It should be noted, therefore, that when fabricating a CMOS, for example, it will be necessary to form different source/drain regions using both n-type and p-type dopants, for example.

Accordingly, the present invention cannot be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed, upon review of the present specification. The claims are intended to cover such modifications and devices.

What is claimed is:

1. A process of fabricating a semiconductor device, comprising:
    forming at least one sacrificial plug over a substrate, the plug defining a region for a gate electrode;
    forming a first insulating layer over the substrate prior to forming the sacrificial plug;
    forming active regions in portions of the substrate adjacent the sacrificial plug;
    forming a film over the portions of the substrate adjacent the sacrificial plug, the sacrificial plug being selectively removable with respect to the film;
    selectively removing the sacrificial plug to leave an opening in the film and expose a portion of the first insulating layer in the opening;
    annealing the exposed portion of the first insulating layer prior to forming the gate electrode; and
    forming a gate electrode in the opening;
    wherein forming the sacrificial plug includes:
        depositing a polysilicon layer over the substrate; and
        selectively etching the polysilicon layer.

2. A process of fabricating a semiconductor device, comprising:
    forming at least one sacrificial plug over a substrate, the plug defining a region for a gate electrode;
    forming a first insulating layer over the substrate prior to forming the sacrificial plug;
    forming active regions in portions of the substrate adjacent the sacrificial plug;

forming a film over the portions of the substrate adjacent the sacrificial plug, the sacrificial plug being selectively removable with respect to the film;

selectively removing the sacrificial plug to leave an opening in the film and expose a portion of the first insulating layer in the opening;

annealing the exposed portion of the first insulating layer prior to forming the gate electrode; and forming a gate electrode in the opening;

wherein forming the sacrificial plug includes:
forming a nitrogen-bearing layer over the substrate; and
selectively etching the nitrogen-bearing layer.

3. A process of fabricating a semiconductor device, comprising:

forming at least one sacrificial plug over a substrate, the plug defining a region for a gate electrode;

forming a first insulating layer over the substrate prior to forming the sacrificial plug;

forming an active region in portions of the substrate adjacent the sacrificial plug;

forming a film over the portions of the substrate adjacent the sacrificial plug, the sacrificial plug being selectively removable with respect to the film;

selectively removing the sacrificial plug to leave an opening in the film and expose a portion of the first insulating layer in the opening;

annealing the exposed portion of the first insulating layer prior to forming the gate electrode;

forming a gate electrode in the opening; and forming a silicide layer over the active region prior to forming the film.

4. A process of fabricating a semiconductor device, comprising:

forming, over a substrate, at least one sacrificial plug defining a region for a gate electrode, the sacrificial plug being formed from one of nitride, polysilicon or metal;

forming a first insulating layer over the substrate prior to forming the sacrificial plug;

forming active regions in portions of the substrate adjacent the sacrificial plug using the sacrificial plug as a mask;

forming a film covering the active regions adjacent the sacrificial plug, the sacrificial plug being selectively removable with respect to the film;

planarizing the film with the sacrificial plug;

selectively removing the sacrificial plug to leave an opening in the film and expose a portion of the first insulating layer in the opening after planarizing the film;

annealing the exposed portion of the first insulating layer prior to forming the gate electrode; and forming a gate electrode in the opening.

5. The process of claim 4, further including using the first insulating layer as a gate insulating layer.

6. The process of claim 4, wherein the annealed first insulating layer forms a gate insulating layer.

7. The process of claim 4, wherein removing the sacrificial plug includes exposing a portion of the first insulating layer in the opening, the process further including depositing a second insulating layer over the exposed portion of the first insulating layer prior to forming the gate electrode, the first and second insulating layers forming a gate insulating layer.

8. The process of claim 4, wherein removing the sacrificial plug includes exposing a portion of the first insulating layer in the opening, the process further including removing the exposed portion of the first insulating layer prior to forming the gate electrode and forming a new insulating layer in the opening after removing the exposed portion of the first insulating layer, the new insulating layer forming a gate insulating layer.

9. The process of claim 4, the sacrificial plug is formed on an upper surface of the substrate and removing the sacrificial plug includes exposing a portion of the substrate, the process further including forming a gate insulating layer on the exposed portion of the substrate within the opening.

10. The process of claim 4, further including implanting dopant through the opening before forming the gate electrode to form a punchthrough region.

11. The process of claim 10, further including implanting dopant through the opening before forming the gate electrode to form a voltage threshold region, the voltage threshold region being formed closer to an upper surface of the substrate than the punchthrough region.

12. The process of claim 4, wherein sacrificial plug is formed from the metal, the metal being cobalt.

13. The process of claim 4, sacrificial plug is formed from the polysilicon.

14. The process of claim 4, sacrificial plug is formed from the nitride.

15. The process of claim 14, further including forming a high permittivity oxide layer, having a permittivity greater than that of silicon nitride, over the substrate prior to forming the sacrificial nitride plug, the plug being formed over the high permittivity layer;

wherein forming the active regions includes implanting dopant into the substrate using the plug as a mask and annealing the implanted dopant;

wherein the nitride plug inhibits oxidation of the high permittivity oxide layer during the anneal.

16. The process of claim 15, wherein the high permittivity layer has a permittivity ranging from 200 to 1000.

17. The process of claim 16, wherein implanting the dopant includes implanting the dopant through the high permittivity layer.

18. The process of claim 15, wherein the high permittivity layer is formed from a barium strontium titanate.

19. The process of claim 15, wherein the high permittivity layer is formed from a titanium oxide.

20. The process of claim 15, wherein the high permittivity layer is formed from a lead zinc titanate.

21. The process of claim 4, wherein forming the gate electrode includes depositing and planarizing a gate electrode material to completely fill the opening.

* * * * *